United States Patent
Edwards et al.

[11] Patent Number: 6,111,314
[45] Date of Patent: Aug. 29, 2000

[54] THERMAL CAP WITH EMBEDDED PARTICLES

[75] Inventors: David L. Edwards, Poughkeepsie; Patrick A. Coico, Fishkill; Sushumna Iruvanti, Wappingers Falls; Frank L. Pompeo, Montgomery; Raed A. Sherif, Croton; Hilton T. Toy, Wappingers Falls, all of N.Y.

[73] Assignee: International Business Machines Corporation, Armonk, N.Y.

[21] Appl. No.: 09/140,583

[22] Filed: Aug. 26, 1998

[51] Int. Cl.[7] ................................................ H01L 23/12
[52] U.S. Cl. .......................... 257/704; 257/705; 257/778; 257/787; 257/712; 257/713; 257/718; 257/710
[58] Field of Search ..................... 257/778, 787, 257/712, 713, 718, 705, 710, 704

[56] References Cited

U.S. PATENT DOCUMENTS

| | | |
|---|---|---|
| 3,704,166 | 11/1972 | Cuomo et al. .......................... 117/217 |
| 4,634,600 | 1/1987 | Shimizu et al. . |
| 4,849,247 | 7/1989 | Scanlon et al. . |
| 4,886,681 | 12/1989 | Clabes et al. . |
| 4,917,953 | 4/1990 | Hioki et al. . |
| 5,023,695 | 6/1991 | Umezawa et al. . |
| 5,045,345 | 9/1991 | Singer ........................................ 427/38 |
| 5,098,609 | 3/1992 | Iruvanti et al. . |
| 5,185,184 | 2/1993 | Koran et al. ............................. 427/299 |
| 5,396,403 | 3/1995 | Patel ........................................ 361/705 |
| 5,430,611 | 7/1995 | Patel et al. .............................. 361/705 |
| 5,591,789 | 1/1997 | Iruvanti et al. . |
| 5,604,978 | 2/1997 | Sherif et al. . |
| 5,623,394 | 4/1997 | Sherif et al. . |
| 5,757,620 | 5/1998 | Edwards et al. . |

*Primary Examiner*—Carl Whitehead, Jr.
*Assistant Examiner*—Matthew Warren
*Attorney, Agent, or Firm*—Aziz M. Ahsan

[57] ABSTRACT

The present invention relates generally to a new method for improving the reliability of cooling designs using thermal paste to cool chips in semiconductor modules and structure thereof. More particularly, the invention encompasses a structure and a method that uses surface chemistry modification of the inside of the thermal cooling caps where it contacts thermal paste. The internal surface of the cap is modified by embedding particles that have the same chemical composition as one or more of the solids used in the thermal paste. The particles may be embedded in the cap by casting, grit blasting, or pressing the particles permanently into the surface.

48 Claims, 1 Drawing Sheet

THERMAL CAP WITH EMBEDDED PARTICLES

FIELD OF THE INVENTION

The present invention relates generally to a new method for improving the reliability of cooling designs using thermal paste to cool chips in semiconductor modules and structure thereof. More particularly, the invention encompasses a structure and a method that uses surface chemistry modification of the inside of the thermal cooling caps where it contacts thermal paste. The internal surface of the cap is modified by embedding particles that have the same chemical composition as one or more of the solids used in the thermal paste. The particles may be embedded in the cap by casting, grit blasting, or pressing the particles permanently into the surface.

BACKGROUND OF THE INVENTION

Semiconductor devices are becoming smaller and more dense with the evolution of new technology. However, increases in circuit density produce a corresponding emphasis on overall chip packaging strategies in order to remain competitive. Chip and substrate manufacturers are therefore constantly being challenged to improve the quality of their products by identifying and eliminating problems, reducing package size and weight, decreasing package costs, providing improved thermal efficiencies and better and more advanced chips. Whereas significant improvements are being made to eliminate systematic problems by reducing process variability, process improvements alone are not sufficient to eliminate all the problems which affect both performance and reliability.

One way to allow high degrees of integration is to provide a highly efficient internal cooling design. A preferred way of cooling high performance SCMs (single chip modules) and MCMs (multi-chip modules) is using thermal paste. Thermal paste is often used as a high thermal conductivity interface material to fill the gaps between the back-side of chips, such as, flip chips, and the inside surfaces of the caps. Producing modules that use thermal paste has multiple challenges, for example, the paste can adhere to the module components, such as, the back surface of the chip and/or the inside of the cap, or the module components should be chemically compatible with the thermal paste. Therefore, the package must be designed such that the thermal paste filled chip-to-cap gap has sufficient thickness that it will form a reliable structure, but not too thick, which could allow the paste to sag out of the gap over time.

U.S. Pat. No. 3,704,166 (Cuomo et al.) the disclosure of which is incorporated herein by reference, discloses a method for improving adhesion between a conductive metal layer (Tungsten or Molybdenum) and a substrate of insulating material (silicon dioxide) at deposition temperatures below 500° C. Basically, the process involves cation substitution in the surface layers of the substrate lattice by low temperature solid state diffusion or ion implantation without modifying the bulk dielectric properties of the substrate. Metal is deposited on the modified substrate surface and the entire structure is heated below 500° C. to achieve adhesion between the deposited metal and the dielectric substrate.

U.S. Pat. No. 4,634,600 (Shimizu et al.) basically discloses a method for forming a thin film on the surface of a substrate to provide a hard surface layer, such as, by forming and coating carbide, nitride, oxide or boride on a substrate (tool bit) in order to increase the abrasion and corrosion resistance. The hard surface layer is obtained by simultaneously vaporizing/ionizing metal and non-metal (Ti and N, for example) ions and accelerating them towards and, implanting them on, the substrate.

U.S. Pat. No. 4,849,247 (Scanlon et al.) discloses a method of applying high energy bondable ion to the surface of a substrate to create a bondable surface for bonding of similar or dissimilar materials.

U.S. Pat. No. 4,886,681 (Clabes, et al.) the disclosure of which is incorporated herein by reference, discloses a technique for improving metal-organic substrate adhesion and for reducing stress between the metal film and the substrate. Low energy reactive ions, electrons or photons are used to alter the surface chemistry of the substrate to a shallow depth between about 10 angstrom and a few hundred angstroms in order to enhance adhesion.

U.S. Pat. No. 4,917,953 (Hioki et al.) discloses a method of forming a solid lubricating film on a ceramic material.

U.S. Pat. No. 5,045,345 (Singer) discloses coating of bulk engineering material with oxidation, corrosion or wear resistant inorganic materials.

U.S. Pat. No. 5,185,184 (Koran et al.) discloses a means of promoting adhesion between a substrate and an activatable adhesive. An adhesion promoter layer that activates the adhesive and promotes bonding is embedded in the substrate surface by adding the activator to the sandblasting material and sandblasting the substrate surface.

U.S. Pat. No. 5,023,695 (Umezawa et al.) discloses a flat plate cooling (FPC). In this structure, a flat cooling plate is just above the array of chips. Thermal paste is used to fill the gaps between the chips and the flat plate.

U.S. Pat. No. 5,098,609 (Iruvanti et al.) the disclosure of which is incorporated herein by reference, discloses stable high solids, high thermal conductivity pastes. The pastes include a thermally conducting solid filler, a nonaqueous liquid carrier and a stabilizing dispersant. The resulting pastes are highly concentrated, of low viscosity, electrically resistive, highly thermally conducting and stable.

U.S. Pat. No. 5,591,789 (Iruvanti et al.) the disclosure of which is incorporated herein by reference, discloses a polyester dispersant for use in high thermal conductivity pastes.

U.S. Pat. Nos. 5,604,978 and 5,623,394, (Sherif et al.) the disclosure of which is incorporated herein by reference, disclose a method and apparatus for the customized cooling of chips on an MCM with a range of cooling requirements. It uses flat plate cooling, and uses pastes of different thermal conductivities on chips to customize the cooling of the chips. The paste is either between the chips and a flat cooling hat, or between the chip and a blind hole in the hat. Surplus paste may also fill some or all of the rest of the inside of the module.

U.S. Pat. No. 5,757,620 (Edwards et al.) the disclosure of which is incorporated herein by reference, discloses a method and apparatus for cooling of chips using blind holes with customized depth. It uses flat plate cooling, and varies the depth of the thermal paste filled gap to customize the cooling to each of the chips on a module, such as, a MCM (Multi-Chip Module).

U.S. patent application Ser. No. 08/758,789, filed on Dec. 3, 1996, (Iruvanti et al.) the disclosure of which is incorporated herein by reference, discloses a hermetically sealed module where the internal surface of the module has a roughened surface by grit blasting or machined to have parallel and/or crossing grooves. The paste penetrates the roughened surface and inhibits the flow of the paste out of the gap.

A variety of surface modification techniques have been disclosed that enhance the adhesion between various materials. A variety of thermal paste cooling applications have been disclosed. Thermal paste offers a combination of low cost hardware, high thermal performance, and module rework ability. What is needed are new methods of improving the reliability of cooling designs using thermal paste or thermal paste like viscous thermal interface materials.

PURPOSES AND SUMMARY OF THE INVENTION

The invention is a novel method and an apparatus for modifying the surface chemistry of the inside of a thermal cooling cap where it contacts thermal paste. This internal surface of the cap is modified by embedding particles that preferably have the same chemical composition as one or more of the solids used in the thermal paste.

Therefore, one purpose of this invention is to provide an apparatus and a method that will have an internal surface of a thermal cap modified by embedding particles that preferably have the same chemical composition as one or more of the solids used in the thermal paste.

Another purpose of this invention is to provide for embedded particles where at least a portion of the surface of the particle is smooth.

Yet another purpose of this invention is to provide for embedded particles where at least a portion of the surface of the particle has at least one sharp edge.

Still another purpose of this invention is to have particles that are embedded into the thermal cap by casting, grit blasting, or pressing the particles permanently into the surface.

Yet another purpose of this invention is to provide an enhanced thermal path between a chip and a heat sink.

Therefore, in one aspect this invention comprises a thermal apparatus comprising at least one thermal cap with at least one first particle embedded therein, and wherein at least one thermal paste having at least one second particle as one of the constituents of said thermal paste, covers at least a portion of said embedded first particle.

In another aspect this invention comprises a thermal apparatus comprising at least one substrate secured to at least one thermal cap, wherein at least one thermal paste provides a heat transfer path between said at least one substrate and said at least one thermal cap, and wherein at least one first particle is embedded in said at least one thermal cap and is in thermal contact with said thermal paste containing at least one second particle.

In yet another aspect this invention comprises a method for providing at least one thermal path, comprising the steps of:

(a) embedding at least one first heat transfer particle into a thermal cap, (b) securing said thermal cap to a substrate such that at least one thermal paste is in physical contact with said at least one first heat transfer particle and wherein said thermal paste provides a heat transfer path between said substrate and said thermal cap.

In still yet another aspect this invention comprises a method for providing at least one thermal path, comprising the steps of:

(a) embedding at least one first heat transfer particle into a thermal cap, (b) covering at least a portion of said first heat transfer particle with at least a portion of at least one thermal paste having at least one second heat transfer particle, such that any heat coming in contact with said thermal paste is transferred to said thermal cap via at least a portion of said first heat transfer particle.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

One way to improve the reliability of thermal paste in semiconductor modules would be to modify the internal surface chemistry of the cap to improve the adhesion of the thermal paste to that surface. The surface would be modified by embedding particles that have the same chemical composition as some or all of the solids used in the thermal paste. By modifying the surface of the cap in this manner, the thermal paste will wet the particles in the surface of the cap, and thus have improved adhesion. This improves the reliability of cooling designs using paste by preventing sagging of the paste out of the chip-to-cap thermal interface. This benefit is greatest when the module is oriented vertically and/or when the gap is large and/or when the cap internal surface is smooth or polished and/or the adhesion of the paste to the cap material is low.

This invention describes one way to improve the reliability of multilayered ceramic (MLC) electronic packages without any loss or degradation of their performance. Packaging methods which improve reliability increase the desirability of such electronic packages in the marketplace. As a person skilled in the art knows, increases in packaging density typically require high performance cooling solutions. There are numerous advantages to cooling with thermal paste.

Figure 1A:
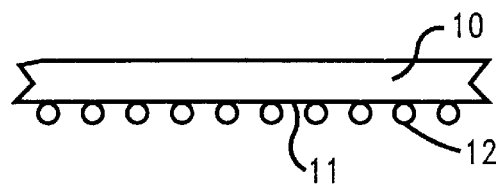
FIG. 1A, illustrates a preferred embodiment of this invention.

FIG. 1A, illustrates a preferred embodiment of this invention. On an inner surface 11, of a thermal cap 10, a plurality of particles 12, are embedded into the inner surface 11. At least one of the heat transfer particle 12, that is embedded is preferably of the same material as a particle that will be used in making the thermal paste that will subsequently come in thermal contact with the inner surface 11, of the thermal cap 10, and provide the thermal transfer. The particles 12, are shown to be smooth, and uniform in size, however, their average particle size, smoothness, material, chemical composition, etc., could vary depending upon the application.

Figure 1B:
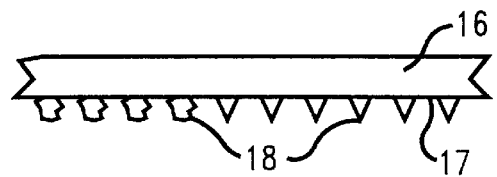
FIG. 1B, illustrates another preferred embodiment of this invention.

FIG. 1B, illustrates another preferred embodiment of this invention. On an inner surface 17, of a thermal cap 16, a plurality of particles 18, are embedded into the inner surface 17. At least one of the particle 18, that is embedded is of the same material as a particle that will be used in making the thermal paste that will subsequently come in contact with the inner surface 17, of the thermal cap 16. The particles 18, are shown to be rough or jagged or have a surface with at least one sharp edge, however, their average particle size, material, chemical composition, etc., could vary depending upon the application.

Figure 2:
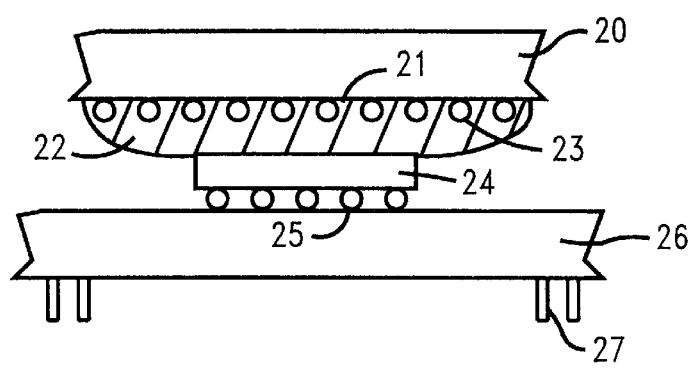
FIG. 2, illustrates another embodiment of the invention where the complete inside surface of a thermal cap has been modified to improve adhesion of the thermal paste.

FIG. 2, illustrates another embodiment of the invention where at least a portion of the inner or inside surface 21, of a thermal cap 20, has been modified to improve adhesion of a thermal paste 22. Typically, a substrate 26, with I/O 27, has one or more chips 24, connected by solder balls or C4 (Controlled Collapse Chip Connection) or solder mass 25. The thermal paste 22, thermally connects the chip 24, to the thermal cap 20, and provides a direct heat transfer path. In order to improve thermal reliability or performance stability, at least a portion of the inner or inside surface 21, of the thermal cap 20, has been modified by embedding particles 23, into at least a portion of the inner surface 21. It has been found that this embedding of particles 23, into the surface 21, of the thermal cap 20, further improves the adhesion of the thermal paste 22. It is preferred that at least one particle 23, that is embedded into the inner surface 21, of the thermal cap 20, is of the same material that is used to make the thermal paste 22. As stated earlier these particles 23, can be smooth or have at least one sharp edge or a combination of surface characteristics, chemical compositions, materials, average particle size, etc.

Figure 3:
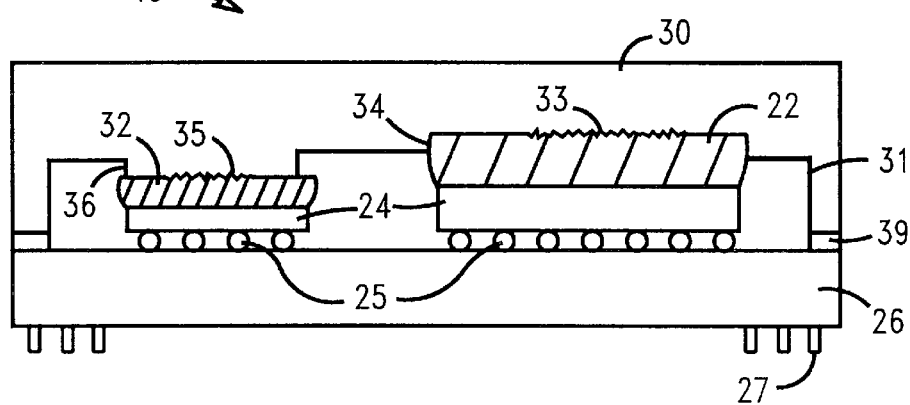
FIG. 3, illustrates a cross-section of a MCM showing the thermal paste in conjunction with this invention to cool chips in the module.

FIG. 3, illustrates a cross-section of a MCM 40, showing the thermal paste 22 and 32, in conjunction with this invention to cool chips 24, in the module 40. Typically, the substrate 26, with I/O 27, has one or more chips 24, connected by solder balls or solder mass 25. Thermal paste 22 and 32, thermally connects the chips 24, to a thermal cap 30, and provides a thermal transfer path. The chips 24, may have similar or different sizes and may have similar or different performance characteristics. The thermal paste 22 and 32, that is used at different chip sites may be similar or different. The cap 30, has an inner surface 31, over each chip, which inner surface 31, may be flat (not shown), or have a protrusion or pedestal 36, or may have a blind hole or cavity 34.

It is preferred that the thermal paste 22 and 32, should be sufficient in placement and volume to completely cover the surface of the chips 24, and also fill the thermal path to the cap 30. The thermal paste 22 and 32, is typically very viscous. The thermal paste 22 and 32, is normally dispensed onto one of the components of the module 40, by either manually screening the thermal paste 22 and 32, through a template, or by use of an automated dispense tool.

Modules 40, are often mounted vertically, and therefore in the vertical position the adhesive and viscous properties of the thermal paste 22 and 32, must resist the force of gravity, or the thermal paste 22 and 32, will sag out of the chip-to-cap gap, degrading the thermal performance of the package or module 40. It should also be appreciated that the cap 30, of the module 40, is secured to the substrate 26, using a cap sealant or solder or some sort of an adhesive 39.

The inventive surface modification is preferably applied at least immediately above the chip 24, at inner surface 31, of the cap 30. This surface modification involves embedding into the inner surface 31, of the thermal cap 30, particles 33 and 35, that are chemically similar to at least one of the solids in the thermal paste 22 and 32.

These particles 33 and 35, may be embedded by any of several methods known in the art, for example casting, grit blasting, or pressing, to name a few. The entire internal surface 31, of the thermal cap 30, may be altered, or only those areas 31, immediately above the flip chips 24, where the enhanced thermal transfer path is desired is altered.

It is preferred that each area 31, that is modified may be embedded with only one of the particles from the paste solid components. However, for some applications it may be necessary to have at least two of the solid components used as the embedded particles.

Since each chip 24, on an MCM 40, may have differing cooling requirements, two or more different pastes 22 and 32, may be used in the same module 40, and in those cases if the thermal pastes 22 and 32, have different chemical compositions it may be desirable to use different surface modifications at the different sites, to correspond to the different thermal pastes that may be used.

The current invention uses surface modification of the caps used in the assembly of flip chip SCMs and MCMs, to enhance the reliability.

For the case of multiple thermal pastes used in an MCM, the same surface treatment may be applied at all chip sites when the pastes use at least one of the same solids, or different surface modifications may be employed when the pastes are dissimilar.

As stated earlier the size of the embedded particles may be all similar, or random in size. The size variation from site to site may also be tailored. For example, proportionally small particles may be desirable for a thin gap above a high power density chip, and larger particles may be desirable for a large gap above a low power density chip. The cap material may also be selected for improved adhesion to the thermal paste.

The embedded particles preferably have a diameter of between about 0.5 microns to about 100 microns, and more preferably have a diameter of between about 1.0 microns to about 20 microns.

Similarly, the solid particles in the paste preferably have a diameter of between about 0.5 microns to about 100 microns, and more preferably have a diameter of between about 1.0 microns to about 20 microns.

This invention enhances the reliability of designs using thermal paste to cool flip chips, which is done by improving the adhesion of the thermal paste to at least a portion of the inside surface of the cap.

Furthermore, with this invention a variety of thermal caps may be used with a greater variety of thermal pastes, as at least one of the solid components of the thermal paste could now also be a part of the thermal cap.

With this invention one also gets the ability to use larger gaps between the chips that need to be cooled and the thermal cap, as portion of the gap has now embedded particles that provide a larger thermal surface contact area.

This invention further allows the ability to use components with looser tolerances, and therefore less expensive.

The particles embedded into the surface of the thermal cap could be of the same size or material characteristics as the solids in the thermal paste, or could be of a different size or characteristics than the solids in the thermal paste.

EXAMPLES

The following examples are intended to further illustrate the invention and are not intended to limit the scope of the invention in any manner.

Example 1

In a preferred embodiment, the cooling cap is made of aluminum, and on at least a portion of its internal surface alumina particles are embedded to be compatible with pastes containing alumina filler.

Example 2

In an alternative embodiment, a different thermal paste utilizing different solids is used, and the cap is not made from the same material as one of the solids in the paste, but the surface is embedded with particles of the same material as used for one of the solids in the paste.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A thermal apparatus comprising at least one thermal cap with a plurality of first particles embedded onto at least one surface of said thermal cap, and wherein at least one thermal paste having a plurality of second particles as one of the constituents of said thermal paste, covers at least a portion of said embedded first particles.

2. The apparatus of claim 1, wherein said thermal cap has a plurality of embedded first particles covering the area which is in thermal contact with said thermal paste.

3. The apparatus of claim 1, wherein said thermal cap has a plurality of embedded first particles and wherein said embedded first particles are embedded in at least a portion of said thermal cap.

4. The apparatus of claim 1, wherein material for said second particles is the same as the material for said first particles which are embedded in said thermal cap.

5. The apparatus of claim 1, wherein material for said second particles is different than the material for said first particles which are embedded in said thermal cap.

6. The apparatus of claim 1, wherein chemical composition for said second particles is the same as the chemical composition for said first particles which are embedded in said thermal cap.

7. The apparatus of claim 1, wherein chemical composition for said second particles is different than the chemical composition for said first particles which are embedded in said thermal cap.

8. The apparatus of claim 1, wherein average particle size of said second particles is the same as the average particle size of said first particles which are embedded in said thermal cap.

9. The apparatus of claim 1, wherein average particle size of said second particles is different than the average particle size of said first particles which are embedded in said thermal cap.

10. The apparatus of claim 1, wherein said first particles are embedded in said thermal cap by means of casting, pressing or grit blasting.

11. The apparatus of claim 1, where said thermal cap is of the same material as at least one solid in said at least one thermal paste.

12. The apparatus of claim 1, wherein at least a portion of the surface of said first particles is smooth.

13. The apparatus of claim 1, wherein at least a portion of the surface of said first particles have at least one sharp edge.

14. The apparatus of claim 1, wherein said thermal cap has a plurality of embedded first particles and wherein said embedded first particles comprise of two or more different materials.

15. The apparatus of claim 1, wherein said thermal cap has a plurality of embedded first particles and wherein said embedded first particles comprise of two or more different materials, and wherein said thermal paste has a plurality of second particles of two or more different materials.

16. The apparatus of claim 1, wherein said thermal cap has a plurality of embedded first particles and wherein said embedded first particles comprise of two or more different materials, and each of said first particles are embedded in at least a portion of said thermal cap.

17. The apparatus of claim 1, wherein size of said first particles embedded in said thermal cap is proportionally less than the spacing between a substrate and said thermal cap.

18. The apparatus of claim 1, wherein at least one substrate is secured to said thermal cap and wherein said thermal paste provides a thermal path between said substrate and said thermal cap.

19. The apparatus of claim 1, wherein at least one chip is secured to a substrate and wherein said thermal paste provides a thermal path between said chip and said thermal cap.

20. The apparatus of claim 1, wherein at least one chip is secured to a substrate and wherein said thermal paste provides a thermal path between said chip and said thermal cap, and wherein said chip is secured to said substrate by at least one means selected from a group consisting of solder balls, C4s, solder columns or solder mass.

21. The apparatus of claim 1, wherein at least one chip is secured to a substrate and wherein said thermal paste provides a thermal path between said chip and said thermal cap, and wherein said thermal cap has at least one protrusion in said thermal path.

22. The apparatus of claim 1, wherein at least one chip is secured to a substrate and wherein said thermal paste provides a thermal path between said chip and said thermal cap, and wherein said thermal cap has at least one blind hole in said thermal path.

23. The apparatus of claim 1, wherein said first embedded particles preferably have a diameter of between about 0.5 microns to about 100 microns, and more preferably have a diameter of between about 1.0 microns to about 20 microns.

24. The apparatus of claim 1, wherein said second particles in said thermal paste preferably have a diameter of between about 0.5 microns to about 100 microns, and more preferably have a diameter of between about 1.0 microns to about 20 microns.

25. A thermal apparatus comprising at least one substrate secured to at least one thermal cap, wherein at least one thermal paste provides a heat transfer path between said at least one substrate and said at least one thermal cap, and wherein a plurality of first particles are embedded onto at least one surface of said at least one thermal cap and are in thermal contact with said thermal paste containing a plurality of second particles.

26. The apparatus of claim 25, wherein said thermal cap has a plurality of embedded first particles covering the area which is in thermal contact with said thermal paste.

27. The apparatus of claim 25, wherein said thermal cap has a plurality of embedded first particles and wherein said embedded first particles are embedded in at least a portion of said thermal cap.

28. The apparatus of claim 25, wherein material for said second particles is the same as the material for said first particles which are embedded in said thermal cap.

29. The apparatus of claim 25, wherein material for said second particles is different than the material for said first particles which are embedded in said thermal cap.

30. The apparatus of claim 25, wherein chemical composition for said second particles is the same as the chemical composition for said first particles which are embedded in said thermal cap.

31. The apparatus of claim 25, wherein chemical composition for said second particles is different than the chemical composition for said first particles which are embedded in said thermal cap.

32. The apparatus of claim 25, wherein average particle size of said second particles is the same as the average particle size of said first particles which are embedded in said thermal cap.

33. The apparatus of claim 25, wherein average particle size of said second particles is different than the average particle size of said first particles which are embedded in said thermal cap.

34. The apparatus of claim 25, wherein said first particles are embedded in said thermal cap by means of casting, pressing or grit blasting.

35. The apparatus of claim 25, wherein said thermal cap is of the same material as at least one solid in said at least one thermal paste.

36. The apparatus of claim 25, wherein at least a portion of the surface of said first particles is smooth.

37. The apparatus of claim 25, wherein at least a portion of the surface of said first particles have at least one sharp edge.

38. The apparatus of claim 25, wherein said thermal cap has a plurality of embedded first particles and wherein said embedded first particles comprise of two or more different materials.

39. The apparatus of claim 25, wherein said thermal cap has a plurality of embedded first particles and wherein said embedded first particles comprise of two or more different materials, and wherein said thermal paste has a plurality of second particles of two or more different materials.

40. The apparatus of claim 25, wherein said thermal cap has a plurality of embedded first particles and wherein said embedded first particles comprise of two or more different materials, and each of said first particles are embedded in at least a portion of said thermal cap.

41. The apparatus of claim 25, wherein size of said first particles embedded in said thermal cap is proportionally less than the spacing between a substrate and said thermal cap.

42. The apparatus of claim 25, wherein at least one substrate is secured to said thermal cap and wherein said thermal paste provides a thermal path between said substrate and said thermal cap.

43. The apparatus of claim 25, wherein at least one chip is secured to a substrate and wherein said thermal paste provides a thermal path between said chip and said thermal cap.

44. The apparatus of claim 25, wherein at least one chip is secured to a substrate and wherein said thermal paste provides a thermal path between said chip and said thermal cap, and wherein said chip is secured to said substrate by at least one means selected from a group consisting of solder balls, C4s, solder columns or solder mass.

45. The apparatus of claim 25, wherein at least one chip is secured to a substrate and wherein said thermal paste provides a thermal path between said chip and said thermal cap, and wherein said thermal cap has at least one protrusion in said thermal path.

46. The apparatus of claim 25, wherein at least one chip is secured to a substrate and wherein said thermal paste provides a thermal path between said chip and said thermal cap, and wherein said thermal cap has at least one blind hole in said thermal path.

47. The apparatus of claim 25, wherein said first embedded particles preferably have a diameter of between about 0.5 microns to about 100 microns, and more preferably have a diameter of between about 1.0 microns to about 20 microns.

48. The apparatus of claim 25, wherein said second particles in said thermal paste preferably have a diameter of between about 0.5 microns to about 100 microns, and more preferably have a diameter of between about 1.0 microns to about 20 microns.

* * * * *